(12) United States Patent
Maeda et al.

(10) Patent No.: US 8,836,095 B2
(45) Date of Patent: Sep. 16, 2014

(54) ELECTRONIC COMPONENT PACKAGE AND BASE OF THE SAME

(75) Inventors: Yoshiki Maeda, Kakogawa (JP); Tsuyoshi Kusai, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 179 days.

(21) Appl. No.: 13/392,540

(22) PCT Filed: Mar. 11, 2011

(86) PCT No.: PCT/JP2011/055738
§ 371 (c)(1),
(2), (4) Date: Feb. 27, 2012

(87) PCT Pub. No.: WO2011/118415
PCT Pub. Date: Sep. 29, 2011

(65) Prior Publication Data
US 2012/0152585 A1    Jun. 21, 2012

(30) Foreign Application Priority Data
Mar. 24, 2010   (JP) .................................. 2010-067467

(51) Int. Cl.
| H05K 5/06 | (2006.01) |
| H05K 1/11 | (2006.01) |
| H01L 23/053 | (2006.01) |
| H03H 9/10 | (2006.01) |

(52) U.S. Cl.
CPC .... *H03H 9/1021* (2013.01); *H01L 2924/16195* (2013.01); *H01L 23/053* (2013.01); *H01L 2924/15313* (2013.01); *H01L 2924/09701* (2013.01); *H01L 2924/15787* (2013.01)

USPC ........ 257/678; 174/50.51; 174/261; 257/692; 257/773

(58) Field of Classification Search
USPC ................ 174/50.51, 261; 257/678, 692, 773
See application file for complete search history.

(56) References Cited

U.S. PATENT DOCUMENTS 6,229,404 B1 * 5/2001 Hatanaka ........................ 331/68
(Continued)

FOREIGN PATENT DOCUMENTS

| JP | 06-177695 A | | 6/1994 | |
| JP | 06177695 A | * | 6/1994 | ............... H03H 9/02 |
| JP | 11-261365 A | | 9/1999 | |
| JP | 11261365 A | * | 9/1999 | ............... H03H 9/02 |
| JP | 2004-254251 A | | 9/2004 | |

(Continued)

*Primary Examiner* — Long K Tran
*Assistant Examiner* — Jordan Klein
(74) *Attorney, Agent, or Firm* — Marvin A. Motsenbocker; Mots Law, PLLC

(57) ABSTRACT

A base of an electronic component package holds an electronic component element. The base has a bottom face in a rectangular shape in plan view. The base includes a pair of terminal electrodes having a rectangular shape on the bottom face. The pair of terminal electrodes are to be bonded on an external circuit substrate with a conductive bonding material. The pair of terminal electrodes have mutually symmetrical shapes. Each of the terminal electrodes has a long side adjacent to or on an edge of a long side of the bottom face. The long side of each of the terminal electrodes is disposed parallel to the long side of the bottom face. The long side of each of the terminal electrodes has a length that is more than half a length of the long side of the bottom face.

19 Claims, 5 Drawing Sheets

(56) References Cited

U.S. PATENT DOCUMENTS

| | | | |
|---|---|---|---|
| 6,998,926 B2 * | 2/2006 | Miyazaki et al. | 331/68 |
| 2004/0135645 A1 * | 7/2004 | Koyama et al. | 331/158 |
| 2005/0184625 A1 * | 8/2005 | Miyazaki | 310/348 |
| 2005/0212387 A1 * | 9/2005 | Sasagawa et al. | 310/348 |
| 2007/0145863 A1 * | 6/2007 | Kusai | 310/348 |
| 2009/0174291 A1 * | 7/2009 | Nagano et al. | 310/344 |

FOREIGN PATENT DOCUMENTS

| | | | | |
|---|---|---|---|---|
| JP | 2004254251 A | * | 9/2004 | H03H 9/02 |

* cited by examiner

ELECTRONIC COMPONENT PACKAGE AND BASE OF THE SAME

TECHNICAL FIELD

The present invention relates to an electronic component package applicable to an electronic device and the like and relates to a base of the electronic component package.

BACKGROUND ART

Piezoelectric resonator devices such as crystal resonators, crystal filters, and crystal oscillators are examples of electronic components that require hermetic enclosure. In each component, a metal film electrode is formed on a surface of a crystal resonator plate, and the crystal resonator plate (specifically, the metal film electrode) is hermetically enclosed so as to protect the metal film electrode from ambient air.

These piezoelectric resonator devices increasingly employ hermetic housing of piezoelectric oscillation plates (crystal resonator plates) in packages made of insulating material such as ceramic in view of demands associated with surface mounting of parts. For example, patent citation PLT 1 discloses a package that includes: a base (mounting board) made of a ceramic material with a mounting portion for a crystal resonator plate; and a lid (cover) having an inverted U-shaped cross-section. The package hermetically encloses the crystal resonator plate, and is mounted on a circuit substrate and bonded with a conductive bonding material such as solder.

The conventional piezoelectric resonator device includes a terminal electrode on a bottom face of the base. The terminal electrode is extended from the bottom face to a side surface of the base through a castellation on the side surface of the base, so as to ensure confirmation of a connection state associated with the capillary action of solder (conductive bonding material).

The conventional piezoelectric resonator device is generally mounted on a circuit substrate that is what is called a glass epoxy substrate made of a glass fiber mesh impregnated with an epoxy resin material, for facilitating the fabrication and saving the cost. Also, a solder paste is applied on an electrode pattern of the circuit substrate by screen printing or the like. Then the piezoelectric resonator device package is mounted on the circuit substrate with the terminal electrode of the piezoelectric resonator device package being overlaid on the electrode pattern of the circuit substrate. Thereafter, the solder paste is melted in a melting furnace (a heating furnace, etc.) in order to bond the piezoelectric resonator device to the circuit substrate with the solder.

CITATION LIST

Patent Literature

PLT 1: Japanese Unexamined Patent Application Publication No. 2002-76813

SUMMARY OF INVENTION

Technical Problem

With the conventional technique, a difference in coefficients of thermal expansion between the electronic component package and the circuit substrate causes a stress in the solder that bonds the electronic component package and the circuit substrate, which could lead to a crack. This problem distinctly arises especially with the combination of an electronic component package of ceramic material such as alumina and a circuit substrate of glass epoxy. The conventional technique is also applied to electronic component packages in electronic devices in automotive applications. Since electronic devices in automotive applications are operated in severe environments, the operation of the electronic devices (including electronic component packages and circuit substrates) in high and low temperature environments likely causes a fatigue failure in the solder, due to the difference in coefficients of thermal expansion between the electronic component package and the circuit substrate.

The problem of cracking, though less significant in ordinary temperature environments, distinctly arises in high and low temperature environments. Additionally, if a shock is applied to the electronic component package and the circuit substrate, solder joint detachment can occur at the solder crack.

When the stress is applied to the solder that is bonding the electronic component package and the circuit substrate which have a difference in coefficients of thermal expansion, the crack often initiates from an area adjacent to the outer periphery edge of the bottom face of the base, where the stress is at its maximum. The crack thus initiated expands toward the center point of the bottom face of the base 1. Finally, the crack in the solder advances to the whole terminal electrode and causes detachment of the solder joint of the electronic component package and the circuit substrate. The detachment completely separates the terminal electrode of the electronic component package from the circuit substrate, and leads to electrical disconnection of the terminal electrode of the electronic component package and the circuit substrate (this state being referred to as open state).

The present invention has been made to solve the above-described problems, and it is an object of the present invention to provide an electronic component package and a base of the electronic component package that prevent the solder crack in order to improve the reliability of the mounting and jointing of the electronic component package and the circuit substrate.

Solution to Problem

In order to achieve the above-described object, according to one aspect of the present invention, a base is of an electronic component package to hold an electronic component element. The base has a bottom face in a rectangular shape in plan view. The base includes a pair of terminal electrodes having a rectangular shape on the bottom face. The pair of rectangle terminal electrodes are to be bonded on an external circuit substrate with a conductive bonding material. The pair of terminal electrodes have mutually symmetrical shapes. Each of the terminal electrodes has a long side adjacent to or on an edge of a long side of the bottom face. The long side of each of the terminal electrodes is disposed parallel to the long side of the bottom face. The long side of each of the terminal electrodes has a length that is more than half a length of the long side of the bottom face.

This configuration ensures that even if a difference in coefficients of thermal expansion exists between the base, which forms a part of the electronic component package, and the circuit substrate, the influence that the strain has on the conductive bonding material bonding the base and the circuit substrate is reduced.

In particular, the pair of terminal electrodes have mutually symmetrical shapes. The long side of each of the terminal electrodes is disposed adjacent to or on an edge of the long side of the bottom face, and the long side of each of the terminal electrodes is disposed parallel to the long side of the bottom face. The long side of each of the terminal electrodes has a length that is more than half a length of the long side of the bottom face. This configuration ensures a facing zone where the terminal electrodes face one another in the short side direction adjacent to the center of the long side of the bottom face, regardless of the position of each of the terminal electrodes along the long side of the bottom face. This ensures a bonding area associated with the conductive bonding material in the zone. The bonding area undergoes minimized influence of the strain occurring from the outer periphery edge of the bottom face toward the vicinity of the center of the bottom face, and minimizes occurrence of the strain occurring from the vicinity of the center of the bottom face toward the outer periphery edge of the bottom face.

With the present invention, the pair of terminal electrodes have mutually symmetrical shapes. The long side of each of the terminal electrodes is disposed adjacent to or on an edge of the long side of the bottom face, and the long side of each of the terminal electrodes is disposed parallel to the long side of the bottom face. The long side of each of the terminal electrodes has a length that is more than half a length of the long side of the bottom face. This results in the conductive bonding material being applied in a band along the long side direction of the bottom face. This prevents the strain occurring in the long side direction of the base and reduces the influence that the difference in coefficients of thermal expansion has on the short side direction of the base. As a result, the occurrence of a crack itself decreases. Additionally, the conductive bonding material is continuously applied in a band over each of the terminal electrodes. This eliminates the occurrence of a crack from the inward of the terminal electrodes toward the periphery of the terminal electrodes compared with, for example, the configuration of applying the conductive bonding material across two electrodes. That is, the occurrence of cracking is limited to one point, which ensures that even if cracking should occur, this does not result in cracks in multiple directions originating from multiple points. This prevents the terminal electrodes from turning into the open state off the circuit substrate and from failing to serve as electronic components.

In the above configuration, a bump may be integrally layered on the terminal electrode. The bump has a smaller area than an area of the terminal electrode.

The inventors have perceived that in most cases of cracking in conductive bonding materials, a crack in a conductive bonding material initiates from a bottom face edge of the terminal electrode, and that the crack occurring at the bottom face edge of the terminal electrode develops from the initiation point in a direction approximately parallel to the bottom face position of the terminal electrode, if there is no barrier against the development of crack. This perception serves as a basis of the above-described configuration in which a bump is integrally layered over each of the pair of terminal electrodes, and the bump has a smaller plane area than a plane area of each of the terminal electrodes. This, in addition to the above-described advantageous effects, realizes a displacement between: a position of development of a crack adjacent to the edge of the terminal electrode in the long side direction, where the crack initiates in the conductive bonding material; and a position of development of a crack adjacent to the center of the terminal electrode in the long side direction. The crack first attempting to develop in a direction approximately parallel to the bottom face position of the terminal electrode is subject to the influence of an edge of the bump adjacent to the edge of the terminal electrode, and is thereby shifted in angle to a direction toward the circuit substrate which is not parallel to the bottom face of the terminal electrode. That is, this configuration provides a point of bending of the crack in its course. The existence of the point of bending of a crack impedes the development of the crack. This, as a result, prevents the terminal electrodes from turning into the open state and from failing to serve as electronic components, while at the same time improving the electrical and mechanical coupling properties of the terminal electrodes.

In the above configuration, the pair of terminal electrodes may be mutually symmetrical relative to a center line in a short side direction of the bottom face.

This configuration, in addition to the above-described advantageous effects, ensures that even if a difference in coefficients of thermal expansion exists between the base, which forms a part of the electronic component package, and the circuit substrate, the stress is uniformly distributed to the short side direction of the bottom face, where the stress has less influence.

In the above configuration, the pair of terminal electrodes may be mutually symmetrical relative to a center point of the bottom face.

This configuration, in addition to the above-described advantageous effects, ensures that even if a difference in coefficients of thermal expansion exists between the base, which forms a part of the electronic component package, and the circuit substrate, the stress is uniformly distributed to the short side direction of the bottom face, where the stress has less influence, such that the stress is rotated around the center point of the bottom face of the base.

In the above configuration, a gap area between the terminal electrodes may have a width that is same as a width of each of the terminal electrodes in a short side direction of each of the terminal electrodes.

This configuration, in addition to the above-described advantageous effects, ensures more uniform distribution of the stress even if a difference in coefficients of thermal expansion exists between the base, which forms a part of the electronic component package, and the circuit substrate. This, as a result, further reduces the influence of the strain of the conductive bonding material that bonds the base and the circuit substrate.

In order to achieve the above-described object, according to another aspect of the present invention, an electronic component package includes the above-described base according to the present invention and a lid configured to hermetically enclose an electronic component element.

This invention includes the base according to the present invention, providing similar advantageous effects to those of the base according to the present invention. As a result of hermetic enclosure with the base according to the present invention, the reliability of the mounting and bonding on the circuit substrate improves at low cost.

In the above configuration, each of the terminal electrodes may include a plurality of electrodes, and the electronic component package may be bonded on the external circuit substrate at the plurality of electrodes with the conductive bonding material.

Advantageous Effects of Invention

The present invention prevents solder cracks to improve the reliability of the mounting and bonding of the electronic component package on the circuit substrate.

DESCRIPTION OF EMBODIMENTS

Embodiments of the present invention will be described below by referring to the accompanying drawings. In the following embodiments, the present invention is applied to a package of a surface-mount crystal resonator (hereinafter referred to as crystal resonator) as a package for an electronic component.

Figure 1:
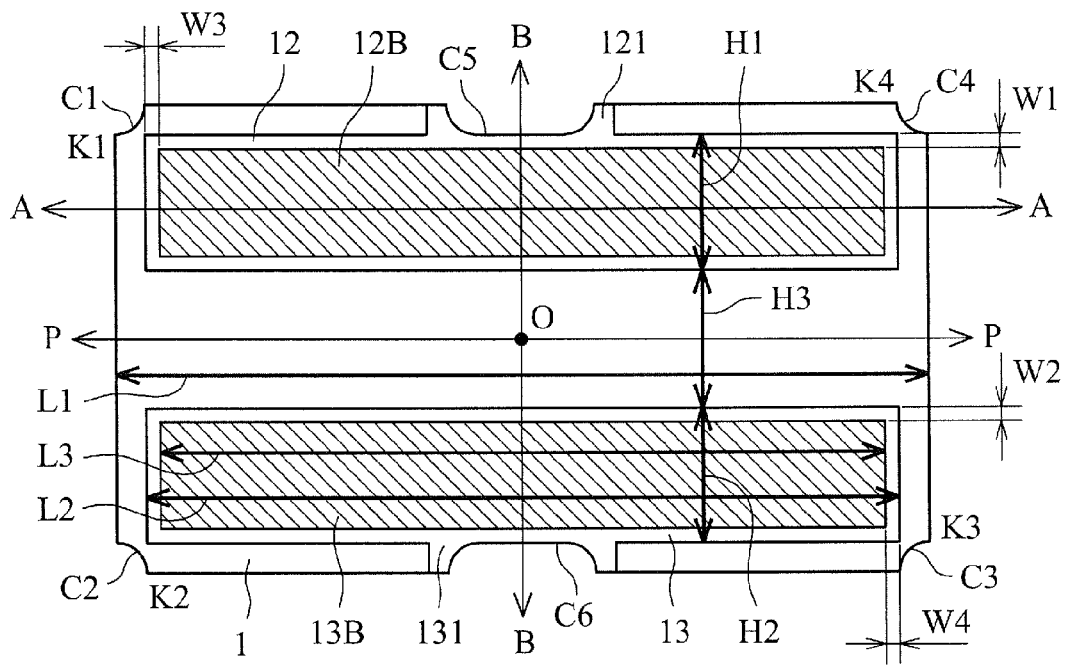
FIG. 1 is a bottom view of a surface-mount crystal resonator according to an embodiment of the present invention.
Figure 2:
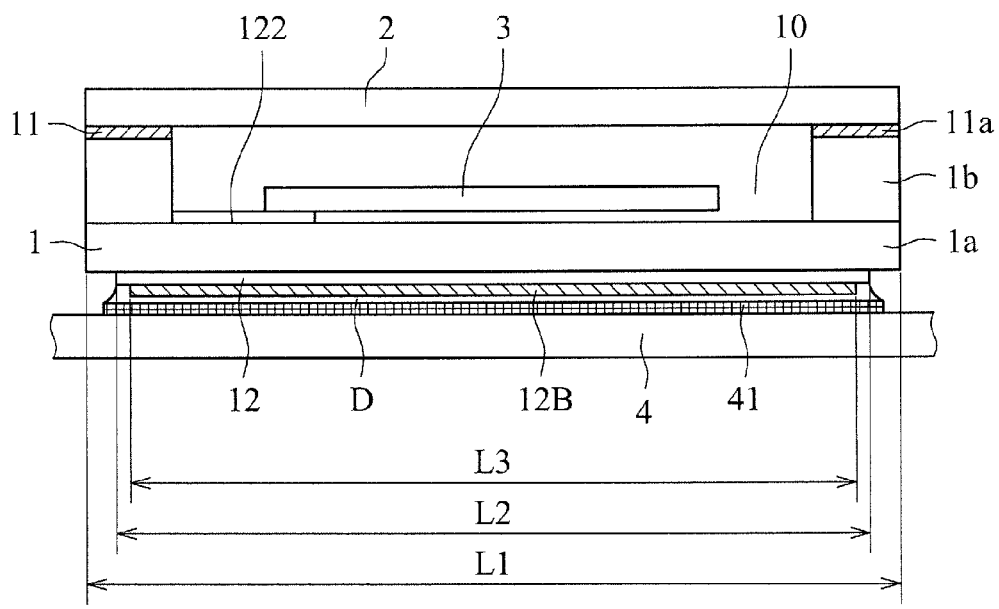
FIG. 2 is a cross-sectional view of the surface-mount crystal resonator on a circuit substrate taken along the line A-A of FIG. 1.
Figure 3:
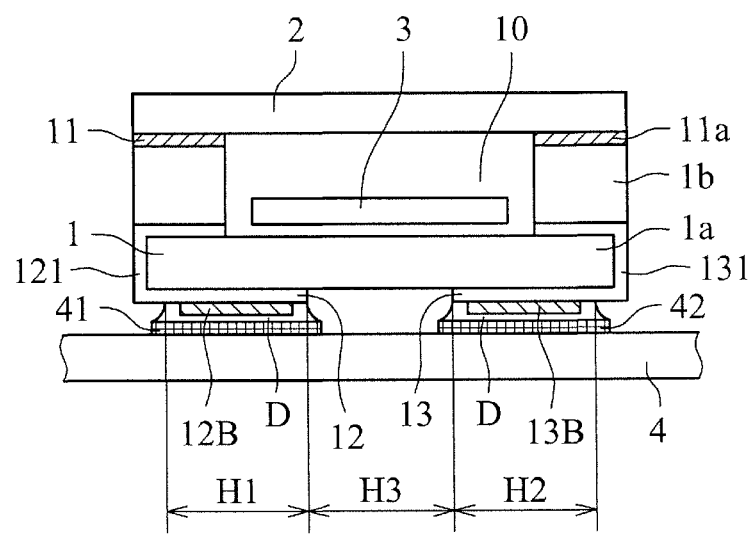
FIG. 3 is a cross-sectional view of the surface-mount crystal resonator on the circuit substrate taken along the line B-B of FIG. 1.

The crystal resonators according to the embodiments are applicable to electronic devices in automotive applications assuming high and low temperature environments, and in particular, applicable to principal electronic devices such as ECUs (Engine Control Units). As shown in FIGS. 1, 2, and 3, the crystal resonator according to an embodiment of the present invention includes: a crystal resonator plate 3 as an electronic component element; a base 1 having a depressed portion with an opening at its top portion to hold (house) the crystal resonator plate 3; and a lid 2 coupled to the opening of the base 1 so as to hermetically enclose the crystal resonator plate 3 held on the base 1.

The base 1 has a rectangular parallelepiped shape as a whole and includes layers of, as necessary, a ceramic such as an alumina and a conductive material such as tungsten and molybdenum. As shown in FIGS. 2 and 3, the base 1 includes a housing space 10 that has a U-shaped cross-section, and a dike portion 11 disposed to surround the housing space 10. Specifically, the base 1 includes a base substrate body 1a that is a rectangular (rectangular in plan view), flat plate ceramic, and a ceramic framing body 1b having a large opening in its center with an outer size (an outer size in plan view) about the same as an outer size of the base substrate body 1a. The base substrate body 1a, the framing body 1b, and a sealing member 11a are integrally baked. The dike portion 11 (the framing body 1b) has a flat top face that is covered with the sealing member 11a (a sealing material, a metal layer, or the like). While in this embodiment glass is formed as the sealing member 11a, this should not be construed in a limiting sense; the material of the sealing member 11a may be selected depending on materials of the base 1 and the lid 2. For example, if the lid 2 is a metal lid, the sealing member 11a may include a metallized layer such as a tungsten layer and a molybdenum layer with a nickel plating layer and a gold plating layer covering the top face of the metallized layer. Further, a metal ring may be formed over the plating layers.

As shown in FIG. 1, the base 1 includes castellations C1, C2, C3, and C4 vertically extending from the bottom face to the top face of the base 1 on side faces of the base 1 at four corners K1, K2, K3, and K4 around a periphery (a periphery in plan view) of the base 1. As shown in FIGS. 1 and 3, the base 1 includes castellations C5 and C6 vertically extending from the bottom face to the top face (upper face) of the base 1 on side faces adjacent to centers of the long sides of the base 1 (specifically, the bottom face of the base 1).

The bottom face of the base 1 is rectangular in plan view. The base 1 includes a pair of terminal electrodes 12 and 13 in a rectangular shape in plan view along a pair of the long sides of the base 1. The pair of terminal electrodes 12 and 13 are to be bonded on an external circuit substrate 4 (see FIG. 2) with a conductive bonding material D. The pair of terminal electrodes 12 and 13 have mutually symmetrical shapes as shown in FIG. 1. Specifically, as shown in FIG. 1, the pair of terminal electrodes 12 and 13 are mutually symmetrical relative to the line P-P, which is parallel to the long sides of the bottom face of the base 1 and passes through the center point O of the bottom face of the base 1. Each of the terminal electrodes 12 and 13 has a long side adjacent to the ends of the long side of the base 1, and the long side of each of the terminal electrodes 12 and 13 is parallel to each long side of the bottom face of the base 1. This configuration of forming the terminal electrodes 12 and 13 on the bottom face of the base 1 ensures that even if a difference in coefficients of thermal expansion exists between the base 1 and the circuit substrate 4, the stress is uniformly distributed to the short side direction of the bottom face of the base 1, where the stress has less influence.

In this embodiment, as shown in FIG. 1, the long side of each of the terminal electrodes 12 and 13 has a length L2 that is more than half a length L1 of the long side of the bottom face of the base 1. This ensures a facing zone where the terminal electrodes 12 and 13 face one another in the short side direction adjacent to the center of the long side of the bottom face of the base 1, regardless of the position of each of the terminal electrodes 12 and 13 along the long side of the bottom face of the base 1. In particular, it is preferred that each of the terminal electrodes 12 and 13 has a long side length L2 that is equal to or more than 70% of the long side length L1 of the bottom face of the base 1. In this embodiment, the long side length of the base 1 is 2.5 mm while the long side length of each of the terminal electrodes 12 and 13 is 2.3 mm, which is 92% in proportion. In this embodiment, the long side length L2 of each of the terminal electrodes 12 and 13 is shorter than the long side length L1 of the bottom face of the base 1. This embodiment decreases variations in the bonding associated with fillet formation with the conductive bonding material D, which is preferred over the configuration in which the long side length L2 of each of terminal electrodes 12 and 13 is the same as the long side length L1 of the bottom face of the base 1.

In this embodiment, as shown in FIG. 1, a width H1 in the short side direction of the terminal electrode 12, a width H2 in the short side direction of the terminal electrode 13, and a width H3 of a gap area between the terminal electrodes 12 and 13 are the same (which encompasses approximately the same dimensions that one of ordinary skill in the art would conceive). Thus, the short side dimension of the bottom face of the base 1 is evenly split in three. This configuration ensures more uniform distribution of the stress even if a difference in coefficients of thermal expansion exists between the base 1 and the circuit substrate 4. This further reduces the influence of the strain of the conductive bonding material D that bonds the base 1 and the circuit substrate 4.

As shown in FIGS. 1 and 2, the terminal electrodes 12 and 13 respectively extend and are electrically coupled to electrode pads 122 and 132 (the electrode pad 132 is not shown) on the bottom face inside the base 1 via side-face terminal electrodes 121 and 131 in castellations C5 and C6.

The terminal electrodes 12 and 13, the side-face terminal electrodes 121 and 131, and the electrode pads 122 and 132 are each formed as a metallized layer of a metallization material such as tungsten and molybdenum that is baked integrally with the base 1. Over the metallized layer, a nickel plating is formed, over which a gold plating is formed.

The terminal electrodes 12 and 13 respectively include bumps 12B and 13B that are slightly smaller than the terminal electrodes 12 and 13. The bumps 12B and 13B are respectively disposed on the terminal electrodes 12 and 13 concentrically. The bumps 12B and 13B respectively have substantially the same shapes (similarity shape in plan view) as the shapes of the terminal electrodes 12 and 13. The bumps 12B and 13B are made of the same metallization material (tungsten, molybdenum, etc.) as the material of the metallized layers of the terminal electrodes 12 and 13, and integrally formed over the respective metallized layers of the terminal electrodes 12 and 13 in approximately the same shapes as the shapes of the respective metallized layers. This ensures significantly simple fabrication of the bumps 12B and 13B at low cost. The metallization materials of the terminal electrodes 12 and 13 and of the bumps 12B and 13B are baked integrally with the base 1, with nickel platings formed over the metallized layers and gold platings formed over the nickel platings.

The bumps 12B and 13B of the terminal electrodes 12 and 13 have a long side length L3 that is 90% of the long side length L2 of each of the terminal electrodes 12 and 13. Widths W1 to W4 between the edges of the terminal electrodes 12 and 13 and the edges of the bumps 12B and 13B are in a range of 0.01 to 0.5 mm. Specifically, in this embodiment, the terminal electrodes 12 and 13 have a long side length of 2.3 mm while the bumps 12B and 13B have a long side length of 2.1 mm, which is 91% in proportion of the long side length L3 of each of the bumps 12B and 13B relative to the long side length L2 of each of the terminal electrodes 12 and 13. The widths W1 to W4 are 0.1 mm.

Forming the bumps 12B and 13B, which respectively have approximately the same shapes (similarity shapes in plan view) as the shapes of the terminal electrodes 12 and 13, over the terminal electrodes 12 and 13 in a concentric manner impedes the development of cracks occurring in any direction across the terminal electrodes 12 and 13. Employing the above-described length proportions and widths for the bumps 12B and 13B results in the bumps 12B and 13B being slightly smaller than the terminal electrodes 12 and 13, respectively, with approximately the same shapes (similarity shapes in plan view) as the shapes of the terminal electrodes 12 and 13, respectively. Forming such bumps 12B and 13B respectively over the terminal electrodes 12 and 13 provides a point of bending of a crack, at which the development of the crack is shifted in angle, at an initial stage of the development of the crack. Providing the point of bending of crack significantly inhibits the development of the crack compared with a configuration without the bumps 12B and 13B over the terminal electrodes 12 and 13. This result in a preferable configuration that further prevents the terminal electrodes 12 and 13 from turning into the open state and from failing to serve as electronic components, while at the same time improving the electrical and mechanical coupling properties of the terminal electrodes 12 and 13.

The crystal resonator plate 3 (an electronic component element of the present invention) is mounted over the electrode pads 122 and 132. On both front and back sides of the crystal resonator plate 3, a pair of an excitation electrode and an extraction electrode (not shown) are formed. The pair of excitation electrode and extraction electrode are formed on both front and back sides of the crystal resonator plate 3 in the form of, for example, layers of: chrome and gold; chrome, gold, and chrome; chrome, silver, and chrome; or chrome and silver, in the order set forth starting on the crystal resonator plate 3. These electrodes (the pair of excitation electrode and extraction electrode) may be formed by thin-film deposition methods such as a vacuum deposition method and a sputtering method. The crystal resonator plate 3 is secured to the base 1 with the extraction electrodes of the crystal resonator plate 3 electrically and mechanically coupled to the electrode pads 122 and 132 with a conductive bonding material (not shown). Examples of the conductive coupling of the excitation electrodes of the crystal resonator plate 3 to the electrode pads 122 and 132 of the base 1 include use of a conductive resin adhesive and use of a conductive bonding material such as a metal bump, a metallic plating bump, and a brazing filler metal.

As shown in FIGS. 2 and 3, the lid 2, which hermetically encloses the base 1, includes a plate of ceramic material such as alumina and the sealing member 11a formed on the ceramic material and made of glass sealing material or the like. The outer shape in plan view of the lid 2 is approximately the same as, or slightly smaller than, the outer shape in plan view of the base 1. The material of the lid 2 is not limited to the ceramic material, but may be a glass material or a metallic material.

The housing space 10 of the base 1 thus configured houses the crystal resonator plate 3 (specifically, the crystal resonator plate 3 is mounted on electrodes pad 122 and 132), and the lid 2 covers the crystal resonator plate 3. Then the crystal resonator plate 3 is hermetically enclosed by a method such as fusion bonding with a heating furnace, thus completing the crystal resonator (electronic component package). The hermetic enclosure of the crystal resonator plate 3 with the base 1 and the lid 2 is not limited to fusion bonding; other methods are possible such as welding joint and brazing depending on the material (whether it is the base, the lid, or the sealing material). As shown in FIG. 2, the completed product of the crystal resonator is bonded on top of the electrode patterns 41 and 42 of the circuit substrate 4, which is made of a glass epoxy material, with a conductive bonding material D such as solder.

Figure 4:
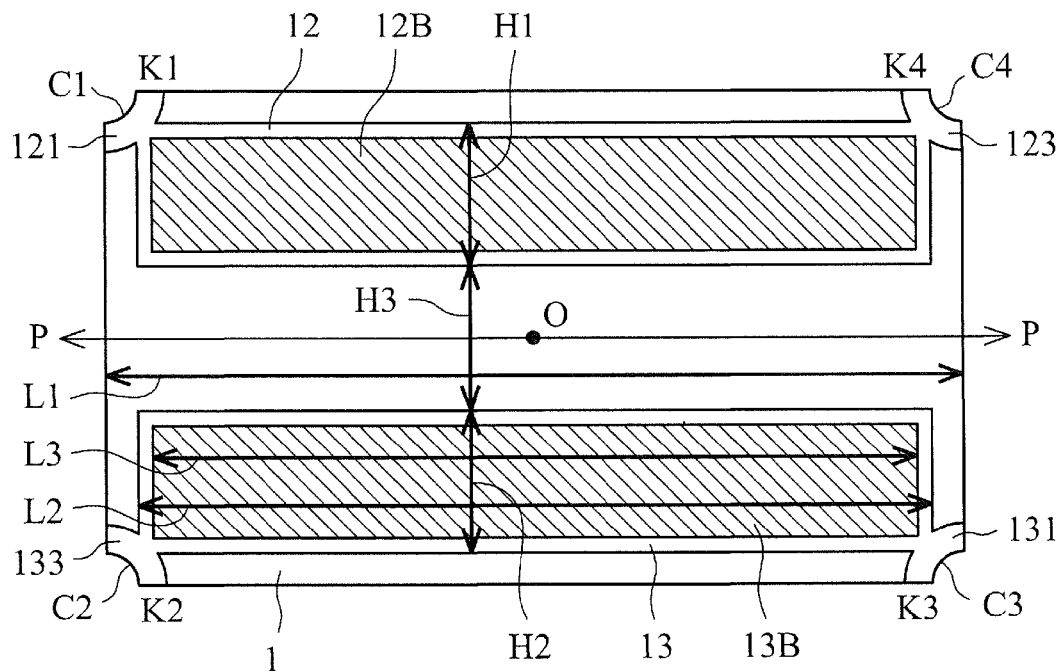
FIG. 4 is a bottom view of a surface-mount crystal resonator according to modification 1 of the present invention.

Next, modification 1 of the embodiment is shown in FIG. 4. Modification 1 is different from the embodiment in the relation among the widths of the terminal electrodes 12 and 13 and the width of gap area, and in the extension configuration of the terminal electrodes 12 and 13. Modification 1 is otherwise similar to the embodiment. The differences will be described below.

In modification 1, a width H1 of the terminal electrode 12 in the short side direction is the same as a width H2 of the terminal electrode 13 in the short side direction. A width H3 of the gap area between the terminal electrode 12 and the terminal electrode 13 is smaller than the widths H1 and H2. This ensures that even if a difference in coefficients of thermal expansion exists between the base 1 and the circuit substrate 4, the influence of the difference is reduced.

In modification 1, the castellations C1, C2, C3, and C4 are respectively formed at the corners K1, K2, K3, and K4, while the castellations C5 and C6 are not formed on the long sides of the base 1. Accordingly, the terminal electrodes 12 and 13 are extended to the castellations C1, C2, C3, and C4 and electrically coupled to the electrode pads 122 and 132, not shown, on the bottom face in the base 1 via the side-face terminal electrodes 121, 131, 123, and 133 formed in the castellations C1, C2, C3, and C4. This configuration enhances the strength of the base 1 and ensures more reliable electrical extension of the terminal electrodes 12 and 13.

Figure 5:
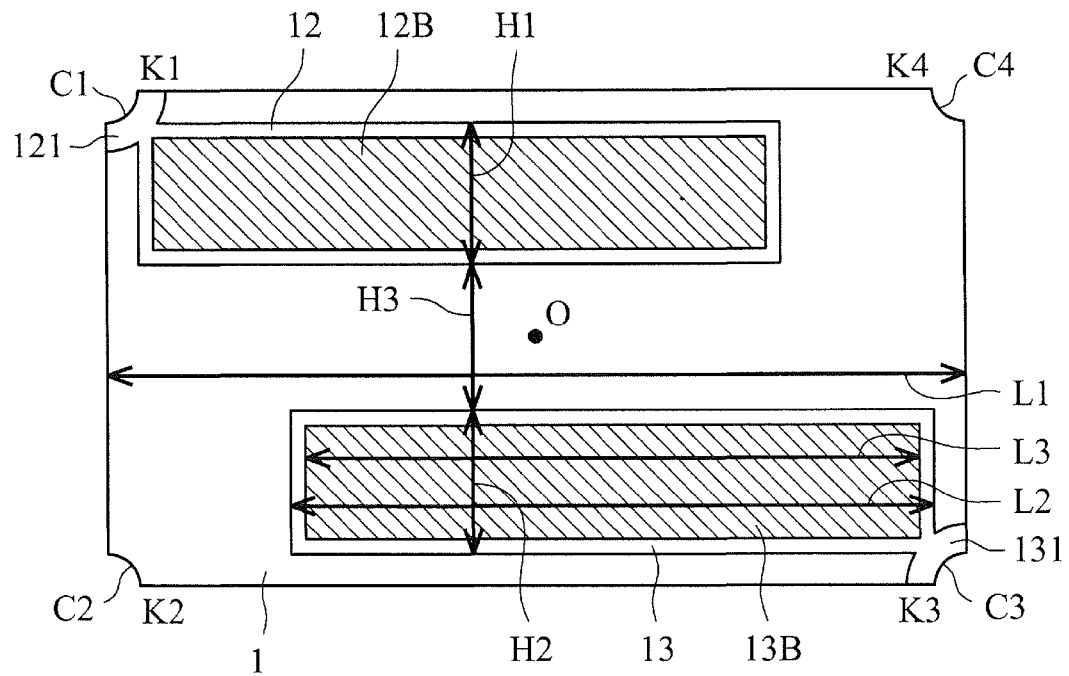
FIG. 5 is a bottom view of a surface-mount crystal resonator according to modification 2 of the present invention.

Next, modification 2 of the embodiment is shown in FIG. 5. In modification 2 is different from the embodiment in the arrangement of the terminal electrodes 12 and 13 on the bottom face of the base 1. The terminal electrodes 12 and 13 are respectively displaced to the corners K1 and K3 and arranged at diagonal positions (corners K1 and K3) mutually symmetrically relative to a center point O of the bottom face of the base 1.

In modification 2, the long side length L2 of the terminal electrodes 12 and 13 has a dimensional proportion of 76% relative to the long side length L1 of the bottom face of the base 1. Specifically, in modification 2, the long side length of the base 1 is 2.5 mm, while the long side length of the terminal electrodes 12 and 13 are 1.9 mm.

In modification 2, the width H1 in the short side direction of the terminal electrode 12, the width H2 in the short side direction of the terminal electrode 13, and the width H3 of the gap area between the terminal electrodes 12 and 13 are the same (which encompasses approximately the same dimensions that one of ordinary skill in the art would conceive).

In modification 2, the castellations C1, C2, C3, and C4 are respectively formed at the corners K1, K2, K3, and K4, while the castellations C5 and C6 are not formed on the long sides of the base 1. The terminal electrodes 12 and 13 are extended to the castellations C1 and C3 and electrically coupled to the electrode pads 122 and 132, not shown, on the bottom face of the base 1 via the side-face terminal electrodes 121 and 131 respectively formed in the castellations C1 and C3. Modification 2 ensures that even if a difference in coefficients of thermal expansion exists between the base 1 and the circuit substrate 4, the stress is uniformly distributed to the short side direction of the bottom face of the base 1, where the stress has less influence, such that the stress is rotated around the center point O of the bottom face of the base 1. Additionally, the strength of the base 1 improves.

Figure 6:
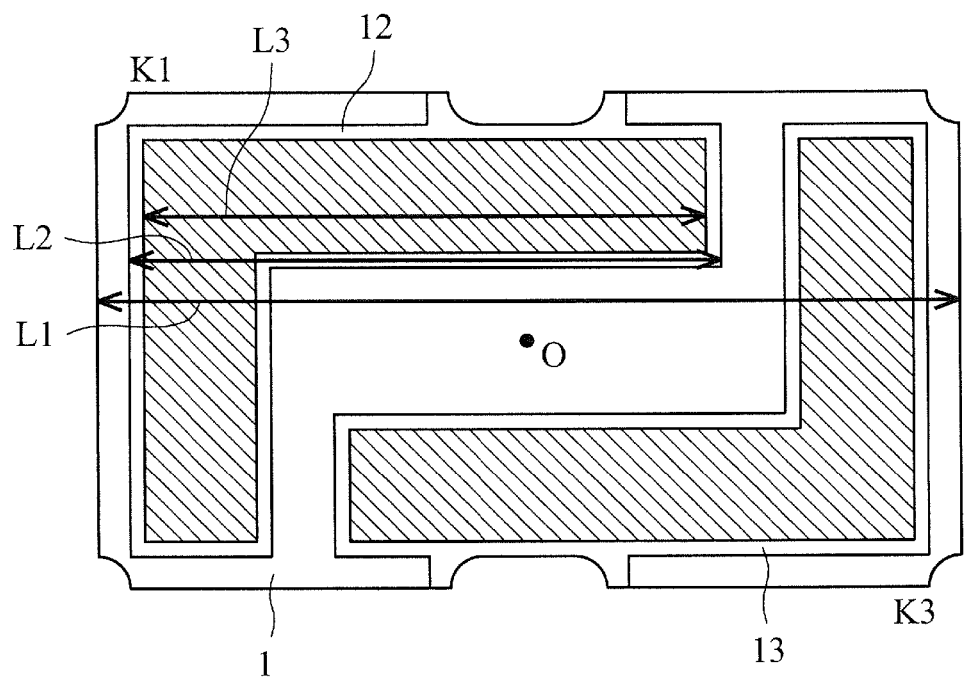
FIG. 6 is a bottom view of a surface-mount crystal resonator according to modification 3 of the present invention.

Next, modification 3 of the embodiment is shown in FIG. 6. Modification 3 is different from the embodiment in the shapes of the terminal electrodes 12 and 13 on the bottom face of the base 1. Modification 3 is otherwise similar to the embodiment. The differences will be described below.

In modification 3, the terminal electrodes 12 and 13 on the bottom face of the base 1 are in such a different arrangement that the terminal electrodes 12 and 13 are respectively displaced to the corners K1 and K3 and arranged at diagonal positions (corners K1 and K3) mutually symmetrically relative to the center point O of the bottom face of the base 1. Each of the terminal electrodes 12 and 13 are not only formed along the long sides of the bottom face of the base 1 but also along the short sides of the bottom face of the base 1, resulting in an L-shape on the bottom face of the base 1. Also in modification 3, the terminal electrodes 12 and 13 are in a pairwise relationship and have mutually symmetrical shapes.

Specifically, the terminal electrode 12 is formed in the L-shape with the corner K1 as a point of bending (basis). The terminal electrode 12 is formed along the long side of the bottom face of the base 1 adjacent to or on the long side edge of the bottom face of the base 1, and also along the short side of the bottom face of the base 1 adjacent to or on the short side edge of the bottom face of the base 1.

The terminal electrode 13 is formed in the L-shape with the corner K3 as a point of bending (basis). The terminal electrode 13 is formed along the long side of the bottom face of the base 1 adjacent to or on the long side edge of the bottom face of the base 1, and also along the short side of the bottom face of the base 1 adjacent to or on the short side edge of the bottom face of the base 1.

Modification 3 ensures that even if a difference in coefficients of thermal expansion exists between the base 1 and the circuit substrate 4 (see FIG. 3), the stress is uniformly distributed to the short side direction of the bottom face of the base 1, where the stress has less influence, such that the stress is rotated around the center point O of the bottom face of the base 1. Additionally, the strength of the base 1 improves.

In modification 3, the terminal electrodes 12 and 13 are disposed along the long sides of the bottom face of the base 1 while being adjacent to or on the long sides of the bottom face of the base 1. The terminal electrodes 12 and 13 are also disposed along the short sides of the bottom face of the base 1 while being adjacent to or on the short sides of the bottom face of the base 1. Thus, modification 3 is preferable regarding the distribution of stress and the improvement of the strength of the base 1, compared with modification 2.

Figure 7:
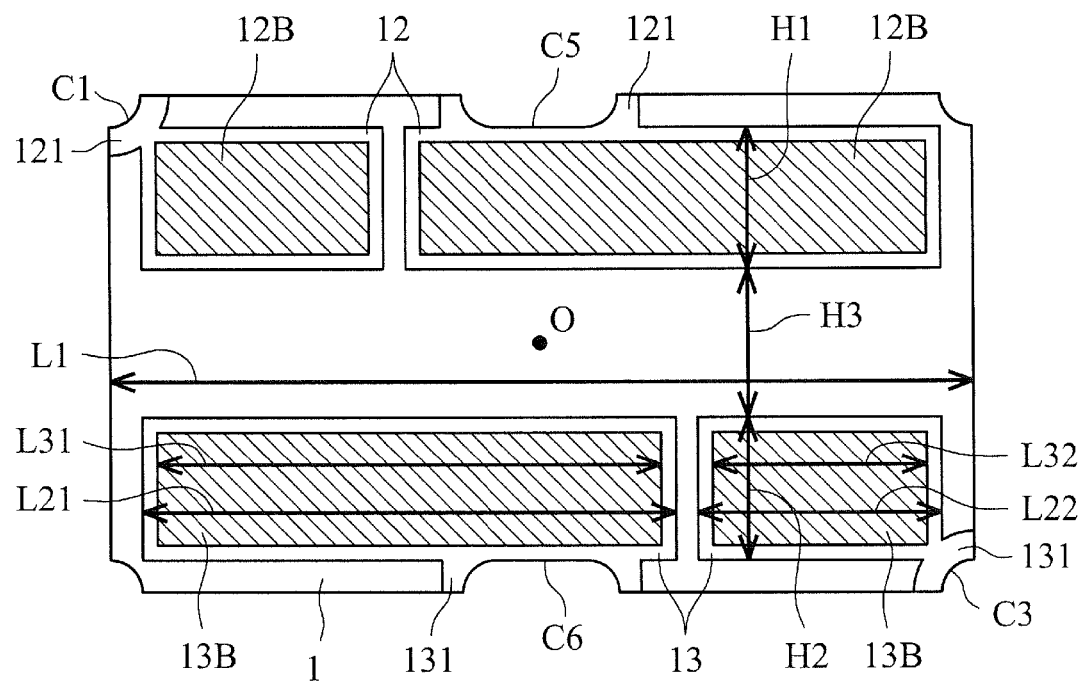
FIG. 7 is a bottom view of a surface-mount crystal resonator according to modification 4 of the present invention.

Next, modification 4 of the embodiment is shown in FIG. 7. Modification 4 is different from the embodiment in the shapes of the terminal electrodes 12 and 13 on the bottom face of the base 1. Modification 4 is otherwise similar to the embodiment. The differences will be described below.

In modification 4, each of the terminal electrodes 12 and 13 is divided. The side-face terminal electrodes 121 and 131 are respectively disposed in the castellations C1 and C3. Also in modification 4, the terminal electrodes 12 and 13 are in a pairwise relationship and have mutually symmetrical shapes.

Specifically, the terminal electrode 12 includes two electrodes. The right side electrode in FIG. 7 is extended to the castellation C5, while the left side electrode in FIG. 7 is extended to the castellation C1. The electrodes are electrically coupled to the electrode pad 122 (see FIG. 2) on the bottom face inside the base 1 via respective side-face terminal electrodes 121. Thus, the two electrodes of the terminal electrode 12 are electrically coupled to one another. The two electrodes of the terminal electrode 12 include bumps 12B of shapes that are similar to their respective electrodes and are smaller in size.

The terminal electrode 13 includes two electrodes. The left side electrode in FIG. 7 is extended to the castellation C6, while the right side electrode in FIG. 7 is extended to the castellation C3. The electrodes are electrically coupled to the electrode pad 132 (not shown) on the bottom face inside the base 1 via respective side-face terminal electrodes 131. Thus, the two electrodes of the terminal electrode 13 are electrically coupled to one another. The two electrodes of the terminal electrode 13 include bumps 13B of shapes that are similar to their respective electrodes and are smaller in size.

When the crystal resonator (base 1) according to modification 4 is bonded on the circuit substrate 4 via the conductive bonding material D (see FIG. 2), the two electrodes of the terminal electrode 12 are coupled to the circuit substrate 4 via the conductive bonding material D. Thus, the conductive bonding material D is bonded over the two electrodes of the terminal electrode 12. Similarly, the two electrodes of the terminal electrode 13 are coupled to the circuit substrate 4 via the conductive bonding material D. Thus, the conductive bonding material D is bonded over the two electrodes of the terminal electrode 13.

In modification 4 shown in FIG. 7, each of the terminal electrodes 12 and 13 includes two electrodes. Accordingly, a sum of long side lengths L21 and L22 of each of the terminal electrodes 12 and 13 corresponds to the long side length L2 of each of the terminal electrodes 12 and 13 shown in FIG. 1 and other drawings. Similarly, a sum of long side lengths L31 and L32 of each of the bumps 12B and 13B corresponds to the long side length L3 of each of the bumps 12B and 13B.

While in modification 4 shown in FIG. 7 each of the terminal electrodes 12 and 13 is divided into two electrodes, this should not be construed in a limiting sense; division into more than two electrodes is also possible.

Figure 8:
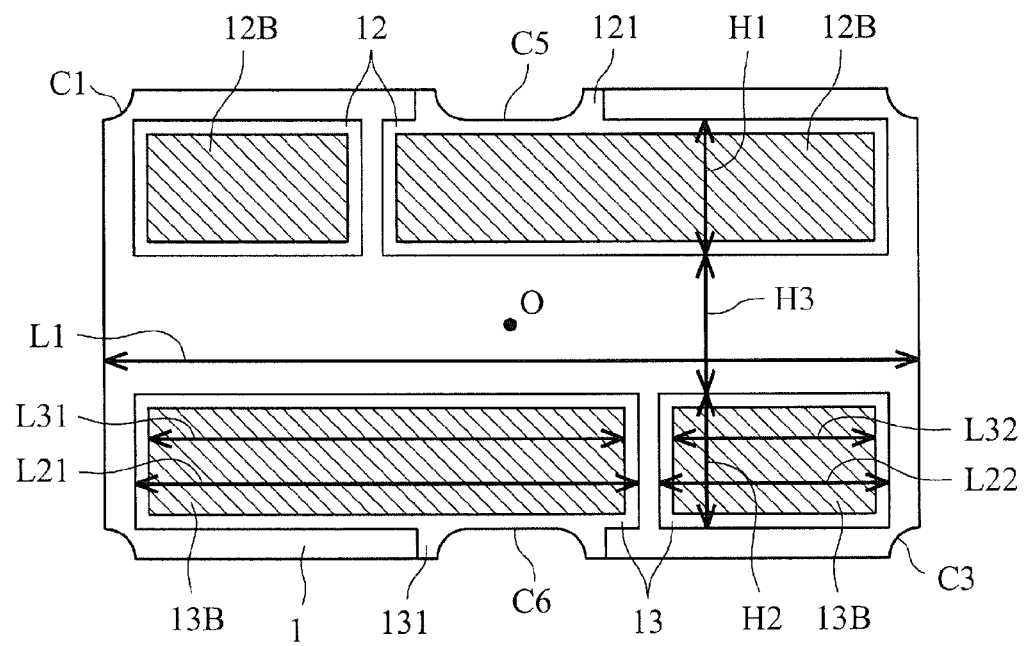
FIG. 8 is a bottom view of a surface-mount crystal resonator according to modification 5 of the present invention.

As shown in FIG. 8, one of the two electrodes of each of the terminal electrodes 12 and 13 in modification 4 shown in FIG. 7 may be a dummy electrode. In FIG. 8, which shows modification 5, the side-face terminal electrodes 121 and 131 need not be formed respectively in the castellations C1 and C3. Also in modification 6, the terminal electrodes 12 and 13 are in a pairwise relationship and have mutually symmetrical shapes.

When the crystal resonator (base 1) according to modification 5 is bonded on the circuit substrate 4 via the conductive bonding material D (see FIG. 2), the terminal electrode 12 and the dummy electrode adjacent to the terminal electrode 12 along the long side of the base 1 may be bonded on the circuit substrate 4 via the conductive bonding material D. In this bonding configuration, the conductive bonding material D is bonded over the terminal electrode 12 and the dummy electrode. Similarly, the terminal electrode 13 and the dummy electrode adjacent to the terminal electrode 13 along the long side of the base 1 may be bonded on the circuit substrate 4 via the conductive bonding material D. In this bonding configuration, the conductive bonding material D is bonded over the terminal electrode 13 and the dummy electrode.

In modification 5 shown in FIG. 8, each of the terminal electrodes 12 and 13 includes two electrodes. Accordingly, a sum of long side lengths L21 and L22 of each of the terminal electrodes 12 and 13 corresponds to the long side length L2 of each of the terminal electrodes 12 and 13 shown in FIG. 1 and other drawings. Similarly, a sum of long side lengths L31 and L32 of each of the bumps 12B and 13B corresponds to the long side length L3 of each of the bumps 12B and 13B.

Figure 9:
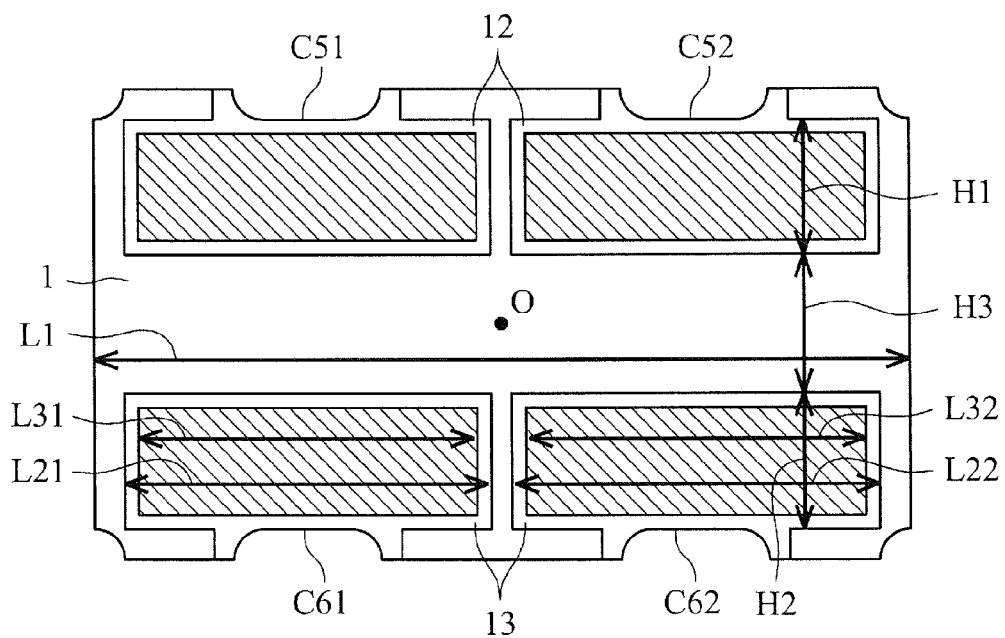
FIG. 9 is a bottom view of a surface-mount crystal resonator according to modification 6 of the present invention.

The configuration of dividing each of the terminal electrodes 12 and 13 into two electrodes is not limited to modification 5 shown in FIG. 7; modification 6 shown in FIG. 9 is also possible.

In modification 6 shown in FIG. 9, two pairs of castellations C51 and C52, and C61 and C62 are equally spaced on each side of opposing sides of the base 1. Each of the divided terminal electrodes 12 and 13 is respectively extended to the castellations C51 and C52, and C61 and C62. Also in modification 6, the terminal electrodes 12 and 13 are in a pairwise relationship and have mutually symmetrical shapes.

When the crystal resonator (base 1) according to modification 6 is bonded on the circuit substrate 4 via the conductive bonding material D (see FIG. 2), the two electrodes of the terminal electrode 12 are bonded on the circuit substrate 4 via the conductive bonding material D. In this bonding configuration, the conductive bonding material D is bonded over the two electrode of the terminal electrode 12. Similarly, the two electrodes of the terminal electrode 13 are coupled to the circuit substrate 4 via the conductive bonding material D. Thus, the conductive bonding material D is bonded over the two electrodes of the terminal electrode 13.

In modification 6 shown in FIG. 9, each of the terminal electrodes 12 and 13 includes two electrodes. Accordingly, a sum of long side lengths L21 and L22 of each of the terminal electrodes 12 and 13 corresponds to the long side length L2 of each of the terminal electrodes 12 and 13 shown in FIG. 1 and other drawings. Similarly, a sum of long side lengths L31 and L32 of each of the bumps 12B and 13B corresponds to the long side length L3 of each of the bumps 12B and 13B.

Modifications 1 to 6 ensure that even if a difference in coefficients of thermal expansion exists between the base 1, which forms a part of the crystal resonator, and the circuit substrate 4, the influence that the strain has on the conductive bonding material D bonding the base 1 and the circuit substrate 4 is reduced. In particular, the terminal electrodes 12 and 13 have mutually symmetrical shapes. The long side of each of the terminal electrodes 12 and 13 is disposed adjacent to or on the edges of the long side of the bottom face of the base 1, and the long side of each of the terminal electrodes 12 and 13 is disposed parallel to the long sides of the bottom face of the base 1. The long side of each of the terminal electrodes 12 and 13 has a length that is more than half the length of the long side of the bottom face of the base 1. This ensures a facing zone where the terminal electrodes 12 and 13 face one another in the short side direction adjacent to the center of the long side of the bottom face of the base 1, regardless of the position of each of the terminal electrodes 12 and 13 along the long side of the bottom face of the base 1. This ensures a bonding area associated with the conductive bonding material in the zone. The bonding area undergoes minimized influence of the strain occurring from the outer periphery edge of the bottom face of the base 1 toward the vicinity of the center of the bottom face of the base 1, and minimizes occurrence of the strain occurring from the vicinity of the center of the bottom face of the base 1 toward the outer periphery edge of the bottom face of the base 1.

In the embodiment and modification 1 to 6, the terminal electrodes 12 and 13 have mutually symmetrical shapes. The long side of each of the terminal electrodes 12 and 13 is disposed adjacent to or on the edges of the long side of the bottom face of the base 1, and the long side of each of the terminal electrodes is disposed parallel to the long sides of the bottom face of the base 1. The long side of each of the terminal electrodes has a length that is more than half the length of the long side of the bottom face of the base 1. Thus, the shape of each of the terminal electrodes 12 and 13 has a long dimension that is more than the half of the long side of the bottom face of the base 1 along the long side direction of the bottom face of the base 1, where the influence of the difference in coefficients of thermal expansion is large. This results in the conductive bonding material D being applied in a band along the long side direction of the bottom face of the base 1. This prevents the strain occurring in the long side direction of the base 1 and reduces the influence that the difference in coefficients of thermal expansion has on the short side direction of the bottom face of the base 1. As a result, the occurrence of a crack itself decreases. Additionally, in this embodiment, the conductive bonding material D is continuously applied in a band over each of the terminal electrodes 12 and 13. This eliminates the occurrence of a crack from the inward of the terminal electrodes 12 and 13 toward the periphery of the terminal electrodes 12 and 13 compared with, for example, the configuration of applying the conductive bonding material across two electrodes. That is, the occurrence of cracking is limited to one point, which ensures that even if cracking should occur, this does not result in cracks in multiple directions originating from multiple points. This prevents the terminal electrodes 12 and 13 from turning into the open state off the circuit substrate 4 and from failing to serve as electronic components.

Additionally, the bumps 12B and 13B, which have slightly smaller plane areas than the areas of the respective terminal electrodes 12 and 13, are respectively integrally layered over the terminal electrodes 12 and 13. This realizes a displacement between: a position of development of a crack adjacent to an edge of the terminal electrodes 12 and 13 in the long side direction, where the crack initiates in the conductive bonding material D; and a position of development of a crack adjacent to the center of the terminal electrodes 12 and 13 in the long side direction. The crack first attempting to develop in a direction approximately parallel to the bottom face position of the terminal electrodes 12 and 13 is subject to the influence of the edges of the bumps 12B and 13B adjacent to the edges of the terminal electrodes 12 and 13, and is thereby shifted in angle to a direction toward the circuit substrate 4 which is not parallel to the terminal electrodes 12 and 13. That is, the crack is bent in its course. Thus, the embodiment and modifications 1 to 6 provides a point of bending of the crack. The existence of the point of bending of a crack impedes the development of the crack. In particular, the terminal electrodes 12 and 13 are respectively similarly shaped and concentric with the bumps 12B and 13B, and the long side length of the bumps 12B and 13B are more than 90% of the long side length of the terminal electrodes 12 and 13. This provides a point of bending of a crack, at which the development of the crack is shifted in angle, at an initial stage of the development of the crack, and significantly impedes the development of the crack. This, as a result, prevents the terminal electrodes 12 and 13 from turning into the open state and from failing to serve as electronic components, while at the same time improving the electrical and mechanical coupling properties of the terminal electrodes 12 and 13.

While in the embodiment and modifications 1 to 6 the long side of each of the terminal electrodes 12 and 13 is disclosed as being adjacent to the long side edge of the bottom face of the base 1, contact on the long side end edge of the bottom face of the base 1 is also possible. While the surface-mount crystal resonator is illustrated by an example, the present invention is also applicable to other surface-mount electronic component packages applicable to electronic devices such as a crystal filter and a crystal oscillator. While a ceramic material is disclosed as the insulating package (base), a glass material or a crystal is also possible. While metallized layers are disclosed as the metallic films of the terminal electrodes, a plating material is also possible.

If, as opposed to the embodiment and modifications 1 to 6, the long side length of the terminal electrodes 12 and 13 is equal or less than half the long side length of the bottom face of the base 1, the terminal electrodes 12 and 13 are possibly formed at positions other than the vicinity of the center of the long side of the bottom face of the base 1. This makes it difficult to ensure a facing zone in the short side direction of the bottom face of the base 1, which leads to failure to reduce the influence of the strain, and additionally, failure to prevent occurrence of strain.

The present invention can be embodied and practiced in other different forms without departing from the spirit and essential characteristics of the present invention. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

This application claims priority to Patent Application No. 2010-067467 filed in Japan on Mar. 24, 2010, which is hereby incorporated by reference in its entirety by claiming the priority.

INDUSTRIAL APPLICABILITY

The present invention finds applications in electronic component packages such as a crystal resonator and in bases of the electronic component packages.

REFERENCE SIGNS LIST

1 Base
2 Lid
3 Crystal resonator plate (electronic component element)
4 Circuit substrate

The invention claimed is:

1. A base of an electronic component package to hold an electronic component element,
    wherein the base has a bottom face in a rectangular shape in plan view,
    wherein the base comprises a pair of terminal electrodes having a rectangular shape on the bottom face, the pair of rectangle terminal electrodes bonded on an external circuit substrate with a conductive bonding material,
    wherein the pair of terminal electrodes have mutually symmetrical shapes that are mutually symmetrical relative to a center line in a short side direction of the bottom face,
    wherein each of the terminal electrodes has a long side adjacent to or on an edge of a long side of the bottom face, the long side of each of the terminal electrodes being disposed parallel to the long side of the bottom face, and
    wherein the long side of each of the terminal electrodes has a length that is more than half a length of the long side of the bottom face.

2. The base of electronic component package according to claim 1, further comprising a bump integrally layered over the terminal electrode, the bump having a smaller area than an area of the terminal electrode.

3. The base of electronic component package according to claim 2,
    wherein the pair of terminal electrodes are mutually symmetrical relative to a center line in a short side direction of the bottom face.

4. The base of electronic component package according to claim 2,
    wherein the pair of terminal electrodes are mutually symmetrical relative to a center point of the bottom face.

5. An electronic component package to hold an electronic component element, the electronic component package comprising:
    the base of the electronic component package according to claim 2; and
    a lid configured to hermetically enclose the electronic component element.

6. The base of electronic component package according to claim 2, wherein a width between an edge of each of the terminal electrodes and an edge of the bump layered over each of the terminal electrodes is in a range of 0.01 to 0.5 mm.

7. The base of electronic component package according to claim 6, wherein a gap area between the terminal electrodes has a width that is same as a width of each of the terminal electrodes in a short side direction of each of the terminal electrodes.

8. An electronic component package to hold an electronic component element, the electronic component package comprising:
    the base of the electronic component package according to claim 6; and
    a lid configured to hermetically enclose the electronic component element.

9. The electronic component package according to claim 8,
    wherein the terminal electrode comprises a plurality of electrodes, and
    wherein the electronic component package is bonded on the external circuit substrate at the plurality of electrodes with the conductive bonding material.

10. The base of electronic component package according to claim 1, wherein the pair of terminal electrodes are mutually symmetrical relative to a center point of the bottom face.

11. The base of electronic component package according to claim 10,
wherein a gap area between the terminal electrodes has a width that is same as a width of each of the terminal electrodes in a short side direction of each of the terminal electrodes.

12. An electronic component package to hold an electronic component element, the electronic component package comprising:
the base of the electronic component package according to claim 10; and
a lid configured to hermetically enclose the electronic component element.

13. The base of electronic component package according to claim 1, wherein a gap area between the terminal electrodes has a width that is same as a width of each of the terminal electrodes in a short side direction of each of the terminal electrodes.

14. An electronic component package to hold an electronic component element, the electronic component package comprising:
the base of the electronic component package according to claim 12; and
a lid configured to hermetically enclose the electronic component element.

15. An electronic component package to hold an electronic component element, the electronic component package comprising:
the base of the electronic component package according to claim 1; and
a lid configured to hermetically enclose the electronic component element.

16. The electronic component package according to claim 15,
wherein the terminal electrode comprises a plurality of electrodes, and
wherein the electronic component package is bonded on the external circuit substrate at the plurality of electrodes with the conductive bonding material.

17. An electronic component package to hold an electronic component element, the electronic component package comprising:
the base of the electronic component package according to claim 1; and
a lid configured to hermetically enclose the electronic component element.

18. The base of electronic component package according to claim 1, wherein the long side length of each of the terminal electrodes is equal to or more than 70% of the long side length of the bottom face of the base.

19. The base of electronic component package according to claim 18, further comprising a bump integrally layered over the terminal electrode, the bump having a smaller area than an area of the terminal electrode.

* * * * *